(12) United States Patent
Davies

(10) Patent No.: US 6,197,640 B1
(45) Date of Patent: Mar. 6, 2001

(54) SEMICONDUCTOR COMPONENT AND METHOD OF MANUFACTURE

(75) Inventor: Robert B. Davies, Tempe, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 09/217,120

(22) Filed: Dec. 21, 1998

(51) Int. Cl.[7] .................................................. H01L 21/336
(52) U.S. Cl. ........................ 438/268; 438/269; 438/273; 438/209; 438/138; 438/275; 438/212; 257/328
(58) Field of Search ...................................... 438/268, 269, 438/273, 206, 209, 138, 275, 212; 257/328, 327, 139

(56) References Cited

U.S. PATENT DOCUMENTS

| | | |
|---|---|---|
| 4,851,888 * | 7/1989 | Ueno . |
| 4,952,992 | 8/1990 | Blanchard . |
| 5,034,336 * | 7/1991 | Seki . |
| 5,273,917 | 12/1993 | Sakurai . |
| 5,751,017 * | 5/1998 | Jang et al. ............................ 257/57 |
| 5,849,634 * | 12/1998 | Iwata .................................. 438/655 |

* cited by examiner

*Primary Examiner*—Long Pham
(74) *Attorney, Agent, or Firm*—Robert D. Atkins; Michael T. Wallace

(57) ABSTRACT

A method of manufacturing a semiconductor component includes providing a semiconductor substrate (200) having top and bottom surfaces, forming a drain electrode (160) at the bottom surface of the semiconductor substrate (200), and simultaneously forming source and gate electrodes (251, 254, 255, 253) at the first surface of the semiconductor substrate (200).

14 Claims, 4 Drawing Sheets

SEMICONDUCTOR COMPONENT AND METHOD OF MANUFACTURE

BACKGROUND OF THE INVENTION

This invention relates, in general, to electronics, and more particularly, to semiconductor components and methods of manufacture.

Vertical metal-oxide-semiconductor field effect transistors (MOSFETs) have large gate-to-drain capacitances, which lower the frequency response of these transistors. These transistors have high gate resistance, which also lowers the frequency response of the transistors. The lower frequency response limits the types of applications in which these transistors can be used.

Accordingly, a need exists for a vertical MOSFET having low gate-to-drain capacitance and low gate resistance to provide a higher frequency response for the MOSFET.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
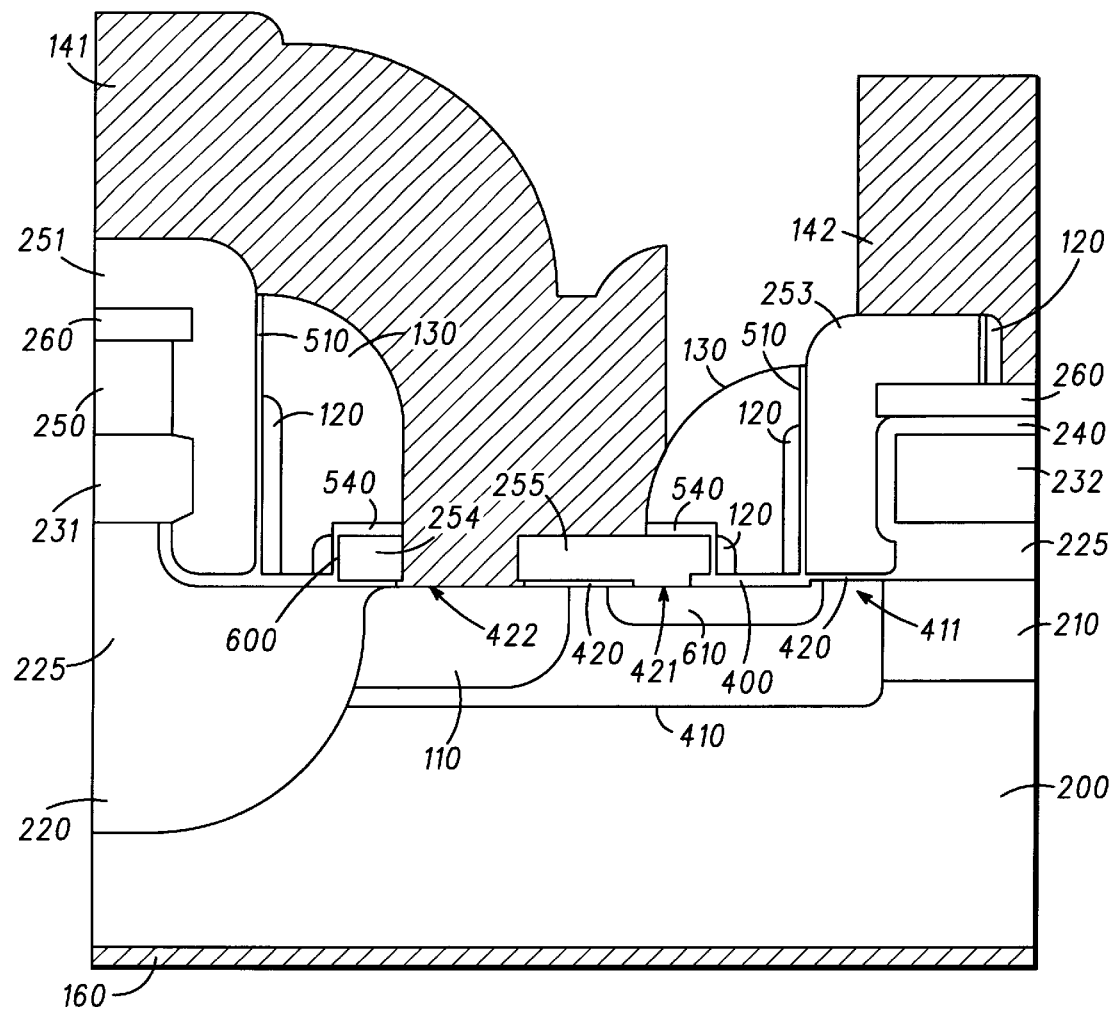
FIG. 1 illustrates an embodiment of a cross-sectional view of a portion of a semiconductor component in accordance with the present invention.

FIG. 1 illustrates a cross-sectional view of a portion of a semiconductor component 100. Component 100 includes a vertical metal-oxide-semiconductor field effect transistor (MOSFET). Component 100 can be an integrated circuit that includes the MOSFET, or component 100 can be a discrete power MOSFET. The MOSFET of FIG. 1 includes, among other features, a drain electrode 160, a gate electrode 253, and a source electrode split into three separate portions 251, 254, and 255. The MOSFET is formed in a semiconductor substrate 200 having a top surface and a bottom surface opposite the top surface. Gate electrode 253 and source electrode portions 251, 254, and 255 are located adjacent to and electrically coupled to the top surface of substrate 200, and drain electrode 160 is located adjacent to and electrically coupled to the bottom surface of substrate 200.

A channel region 410 of a first conductivity type is located in semiconductor substrate 200 underneath gate electrode 253. A channel contact region 110 of the first conductivity type is located in channel region 410 and underneath source electrode portions 254 and 255. A source region 610 of the second conductivity type is also located in semiconductor substrate 200 underneath gate electrode 253 and underneath source electrode portion 255. An enhanced drain region 210 of a second conductivity type is also located underneath gate electrode 253. The second conductivity type is different from the first conductivity type. As an example, the first conductivity type can be p-type, and the second conductivity type can be n-type.

The MOSFET of component 100 also includes a single field plate or shield electrode that has portions 231 and 232, which are electrically shorted together. Portion 231 of the field plate is located adjacent to the top surface of substrate 200 and underneath source electrode portion 251. Portion 231 is also electrically shorted to source electrode portion 251. Portion 232 of the field plate is located adjacent to the top surface of substrate 200 and underneath gate electrode 253. Portion 232 is electrically shorted to portion 231 at a location beyond the active area of the MOSFET. Portion 141 of an electrically conductive layer electrically shorts together channel contact region 110 and source electrode portions 251, 254, and 255.

In operation, a proper gate voltage can invert a portion 411 of channel region 410 directly beneath gate electrode 253. This inversion can convert portion 411 into a conductor to permit lateral current flow from source region 610 to enhanced drain region 210. The current then flows vertically from enhanced drain region 210 through a portion of substrate 200 to drain electrode 160. The portion of substrate 200 serves a non-enhanced portion of the drain region. Portion 232 of the field plate shields drain region 210 from gate electrode 253 to provide improved electrical performance for the vertical MOSFET.

In one embodiment of component 100, FIG. 1 illustrates a left half of an MOSFET. In this embodiment, a mirror image right half of the MOSFET is symmetric to the depicted left half. For example, the right half has a gate electrode that is a mirror image of gate electrode 253 and that overlies a different portion of portion 232 of the field plate where portion 142 of an interconnect layer electrically shorts together gate electrode 253 and the gate electrode of the right half. All of the field plates in this MOSFET are electrically biased to the same potential.

Figure 2:
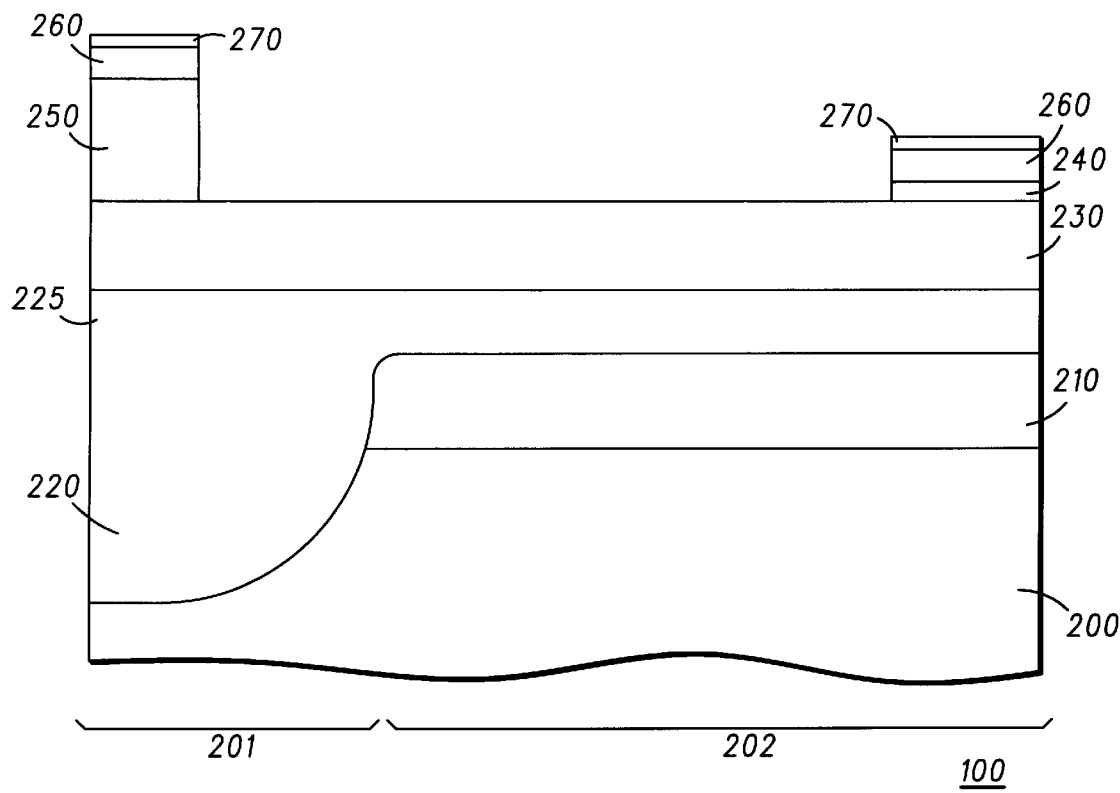
FIGS. 2–6 illustrate embodiments of cross-sectional views of the semiconductor component during different steps of manufacturing.

FIGS. 2–6 illustrate cross-sectional views of semiconductor component 100 during different stages or steps of a manufacturing method or process. In FIG. 2, semiconductor substrate 200 can be comprised of a heavily doped, n-type, monocrystalline silicon substrate and an overlying lightly doped, n-type, silicon epitaxial layer of approximately 10–100 micrometers in thickness. The silicon epitaxial layer is preferably doped as-deposited with arsenic or phosphorous.

Also in FIG. 2, a field oxide layer or region 220 is formed in a portion 201 of substrate 200 using a localized oxidation (LOCOS) process, a high pressure oxidation (HiPOx) process, or the like. As an example, a silicon nitride layer (not shown) can be deposited and patterned over the top surface of a portion 202 in substrate 200. Then, the exposed portion, or portion 201, of substrate 200 can be oxidized to form field oxide region 220.

After removing the silicon nitride layer from over portion 202 of substrate 200, an oxide layer 225 is formed over the entire top surface of substrate 200. As used herein, the term oxide layer is a dielectric layer comprised of silicon dioxide. As an example, an oxide layer can consist substantially of silicon dioxide that is thermally grown in an oxidation furnace or that is deposited by a chemical vapor deposition process. As another example, an oxide layer can consist substantially of tetra-ethyl-ortho-silicate (TEOS) or phosphosilicate glass that is deposited by a chemical vapor deposition process. In the preferred embodiment, the top surface of substrate 200 is thermally oxidized to grow oxide layer 225 to a thickness of approximately 400–600 nanometers.

Then, an enhanced drain region 210 is implanted through oxide layer 225 and into the epitaxial layer of substrate 200. Region 210 has the same conductivity type as substrate 200, which serves as other portions of the drain region. As an example, the implantation process can use arsenic or phosphorous ions to form region 210. Drain region 210 in FIG. 2 represents the active area of the MOSFET.

Subsequently, an electrically conductive layer 230 is formed or deposited over the top surface of substrate 200, over drain region 210, and over oxide layer 225. Layer 230 is used to form a field plate circumscribing and overlying the active area of the MOSFET. In the preferred embodiment, electrically conductive layer 230 is comprised of heavily doped, n-type, amorphous or polycrystalline silicon and is deposited to a thickness of approximately 400–600 nanometers using a chemical vapor deposition process. However, layer 230 can also be comprised of a metallic material.

Next, dielectric structures 240 and 250 are formed over the top surface of substrate 200, oxide layer 225, and electrically conductive layer 230. Dielectric structure 240 overlies drain region 210 and portion 202 of substrate 200, but is absent over field oxide region 220 and portion 201 of substrate 200. Dielectric structure 250 overlies field oxide region 220 and portion 201 of substrate 200, but is absent over drain region 210 and portion 202 of substrate 200. Structure 250 is at least as thick as structure 240, and in the preferred embodiment, structures 240 and 250 have different heights or thicknesses. As illustrated in FIG. 2, structure 240 is shorter or is thinner than structure 250. However, structures 240 and 250 can alternatively have the same height or thickness. A lateral distance between structures 240 and 250, as measured along a direction substantially parallel to the top surface of substrate 200, is preferably approximately 4–6 micrometers.

Structure 240 can be formed before structure 250, or vice versa. As an example, when layer 230 is comprised of silicon, structure 250 can be formed by depositing a layer of TEOS to a thickness of approximately 700–1000 nanometers, and then by patterning or etching the layer of TEOS. Then, structure 240 can be formed by thermally oxidizing electrically conductive layer 230 to form an oxide layer having a thickness of approximately 50–150 nanometers, and then by patterning or etching the thermally grown silicon dioxide layer. The high temperature processing used to form structure 240 eliminates the need for a separate densification process for the TEOS of structure 250. Although structures 240 and 250 are each described to consist of a single dielectric layer, structures 240 and 250 can each be comprised of a plurality of layers.

Then, a nitride layer 260 and a silicon layer 270 are sequentially deposited over structures 240 and 250. Layers 260 and 270 are then etched to form the pattern illustrated in FIG. 2. Alternatively, layers 260 and 270 can be deposited after forming structure 250, but before forming structure 240, and then layers 270 and 260 and structure 240 can be sequentially etched.

As used herein, the term nitride layer is a dielectric layer comprised of silicon nitride. For example, a nitride layer can consist substantially of silicon nitride that is deposited by a chemical vapor deposition process. As another example, a nitride layer can consist substantially of silicon oxy-nitride that is also deposited by a chemical vapor deposition process. Nitride layer 260 is preferably deposited to a thickness of approximately 100–200 nanometers. As used herein, the term silicon layer is a semiconductor layer comprised of silicon. As an example, a silicon layer can consist substantially of amorphous or polycrystalline silicon that is deposited by a chemical vapor deposition process. Silicon layer 270 can be, for example, approximately 15–30 nanometers thick.

Figure 3:
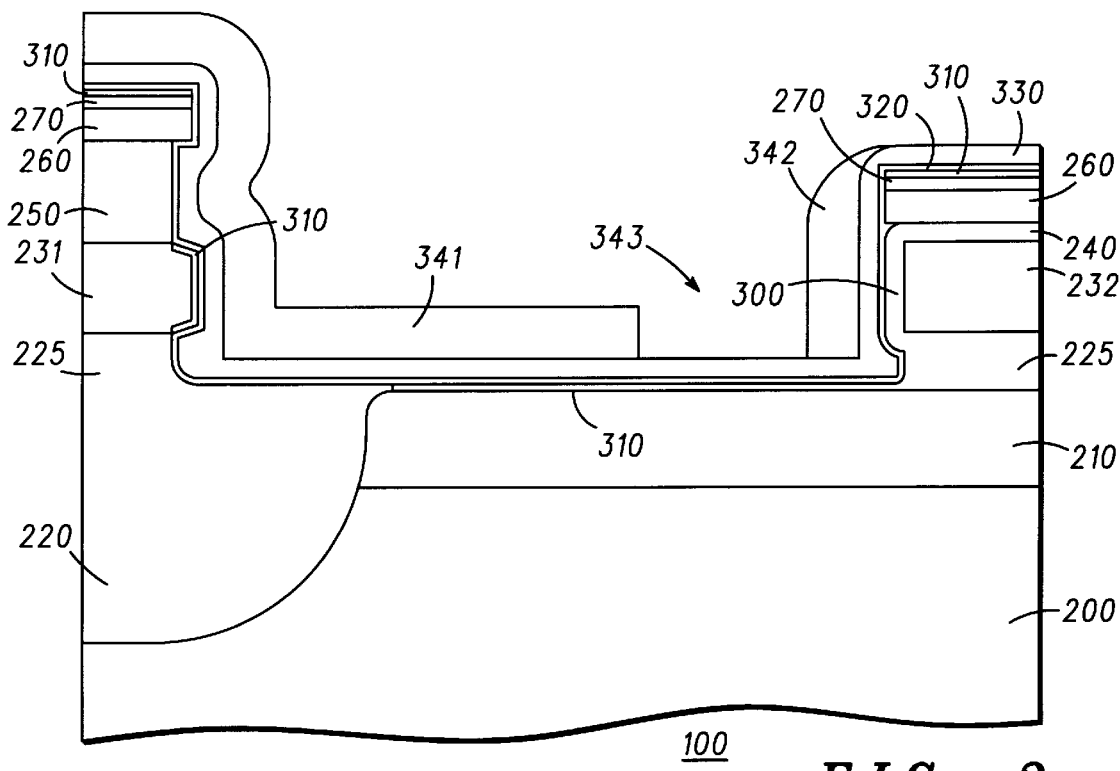

Continuing with FIG. 3, a photoresist layer (not shown), silicon layer 270, nitride layer 260, and dielectric structures 240 and 250 are used as etch masks during the etching of electrically conductive layer 230 (FIG. 2). This etching process converts layer 230 into portions 231 and 232 of the field plate (FIG. 3), which are electrically shorted together by other unetched portions of layer 230 that are not illustrated in the cross-sectional view of FIG. 3. Portion 231 of the field plate overlies field oxide region 220, but is absent over drain region 210. Portion 232 of the field plate overlies drain region 210, but is absent over field oxide region 220. Dielectric structure 240 overlies portion 232 of the field plate while dielectric structure 250 overlies portion 231 of the field plate.

Next, the portion of oxide layer 225 located under the removed portion of layer 230 (FIG. 2) is etched to expose the top surface of substrate 200. A wet etchant is preferably used to etch oxide layer 225 so that the crystalline structure of substrate 200 is not damaged. Then, the exposed sidewall surfaces of portions 231 and 232 of the field plate and the exposed portion of the top surface of substrate 200 are thermally oxidized to form a different oxide layer approximately 10–150 nanometers thick. Most of this oxide layer is subsequently removed, but portion 300 covering the sidewall of portion 232 of the field plate remains. Portion 300 can be protected by an etch mask during the removal of other portions of the oxide layer. Portion 300 of this oxide layer is used to reduce the capacitance between a subsequently formed gate electrode and portion 232 of the field plate.

Then, an oxide layer 310 of approximately 10–25 nanometers in thickness is thermally grown over substrate 200, the sidewall of portion 231 of the field plate, and silicon layer 270. Subsequently, a silicon layer 320 and a nitride layer 330 are sequentially deposited over oxide layer 310. As examples, silicon layer 320 can be approximately 100–200 nanometers thick, and nitride layer 330 can be approximately 150–200 nanometers thick.

An oxide layer is deposited over nitride layer 330, and an etch mask (not shown) is formed over the oxide layer and over nitride layer 330. The etch mask is formed over dielectric structure 250 and over an adjacent portion of drain region 210, but the etch mask is absent over and is not located near dielectric structure 240. The oxide layer is subsequently anisotropically etched to form oxide layer portions 341 and 342. Portion 342 is a spacer that results from the non-masked anisotropic etching of the oxide layer. The width of portion 342 is dependent upon the thickness of the oxide layer that is etched to form portions 341 and 342. Portions 341 and 342 are separated by an opening or hole 343 that overlies drain region 210 and that exposes a portion of nitride layer 330. This portion of nitride layer 330 serves as an etch stop during the etching of the oxide layer.

The portion of nitride layer 330 that is exposed by hole 343 is subsequently etched to extend the depth of hole 343 and to expose a portion of underlying silicon layer 320. Portions 341 and 342 serve as etch masks during the etching of nitride layer 330.

After the wet etching removal of portions 341 and 342, any remaining portion of silicon layer 320 exposed by hole 343 in nitride layer 330 is subsequently removed to expose a portion of oxide layer 310 over drain region 210. The portion of the top surface of substrate 200 underneath oxide layer 310 is thermally oxidized to grow a lens oxide layer 400 (FIG. 4) at the bottom of hole 343. Oxide layer 400 can be approximately 50–70 nanometers thick and can include the exposed portion of oxide layer 310. The position of oxide layer 400 along the top surface of substrate 200 relative to the position of dielectric structure 240 along the top surface of substrate 200 is dependent upon the aforementioned width of spacer or oxide layer portion 342 in FIG. 3. Nitride layer 330, silicon layers 270 and 320, and portions of oxide layer 310 overlying silicon layer 270 are removed after the formation of oxide layer 400.

Figure 4:
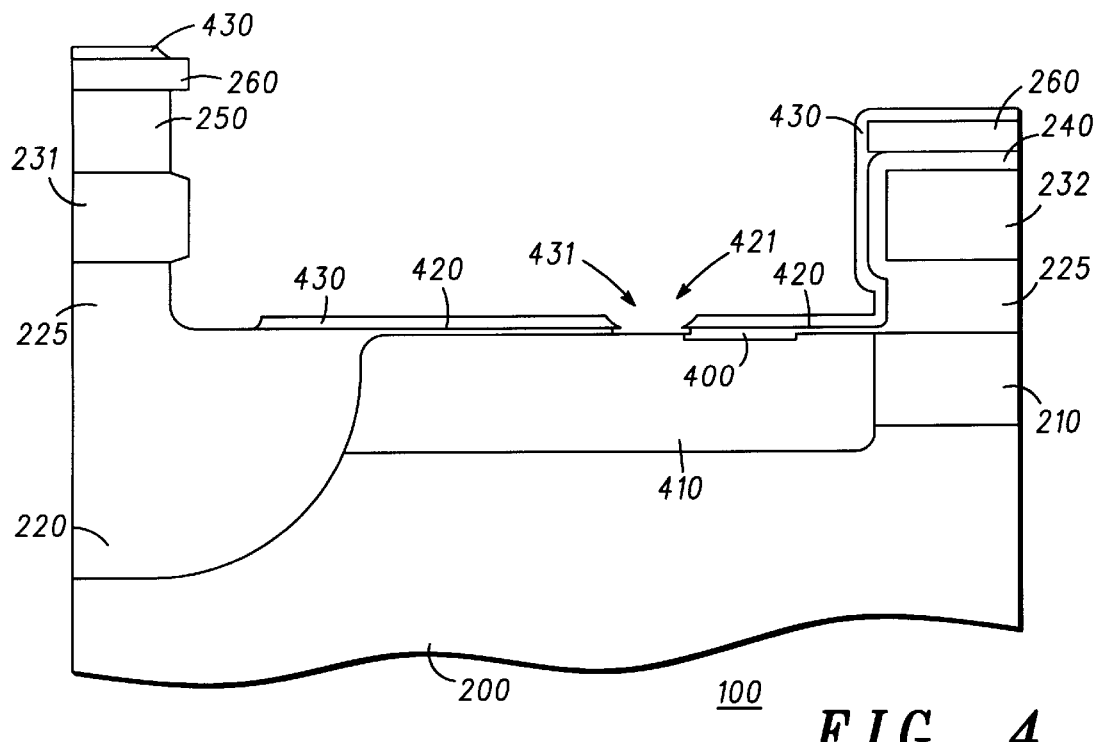

Turning to FIG. 4, a channel region 410 is formed in substrate 200 to overlap and extend into substrate 200 deeper than or beyond drain region 210. As an example, boron ions are implanted through oxide layers 400 (FIG. 4) and 310 (FIG. 3) into the top surface of substrate 200 to form channel region 410. Furthermore, three separate implantations at three different implant energies can be used to implant the dopant into substrate 200 in order to form the profile of channel region 410 in FIG. 4. The dielectric stacks containing dielectric structures 240 and 250 serve as a self-aligned implant mask to position channel region 410 between and contiguous with field oxide region 220 and a remaining portion of drain region 210.

Oxide layer 310 (FIG. 3) is removed using a wet etchant to expose the top surface of substrate 200. This removal process also reduces the thickness of, but does not completely remove, oxide layer 400. A gate oxide layer 420 is thermally grown to replace oxide layer 310 and to serve as the insulator between channel region 410 and a subsequently formed gate electrode of the MOSFET. Gate oxide layer 420 is adjacent to and contiguous with lens oxide layer 400, but is thinner than lens oxide layer 400. As an example, gate oxide layer 420 can have a thickness of approximately 5–40 nanometers.

Next, a silicon layer 430 is formed over oxide layers 400 and 420. As an example, silicon layer 430 can have a thickness of approximately 50–70 nanometers and is preferably comprised of amorphous silicon. Silicon layer 430 is isotropically etched to provide an opening or hole 431 within layer 430. Hole 431 exposes a portion of gate oxide layer 420, and this exposed portion of layer 420 is subsequently removed to form a hole 421 while using silicon layer 430 as an etch mask. Again, a wet etchant is preferably used to etch gate oxide layer 420 so that the crystalline structure of substrate 200 is not damaged and so that any oxide layer over the sidewall of portion 231 of the field plate is also removed. Hole 421 exposes a portion of the top surface of substrate 200 and serves as a connection point between a subsequently formed source electrode over substrate 200 and a subsequently formed source region in substrate 200.

Figure 5:
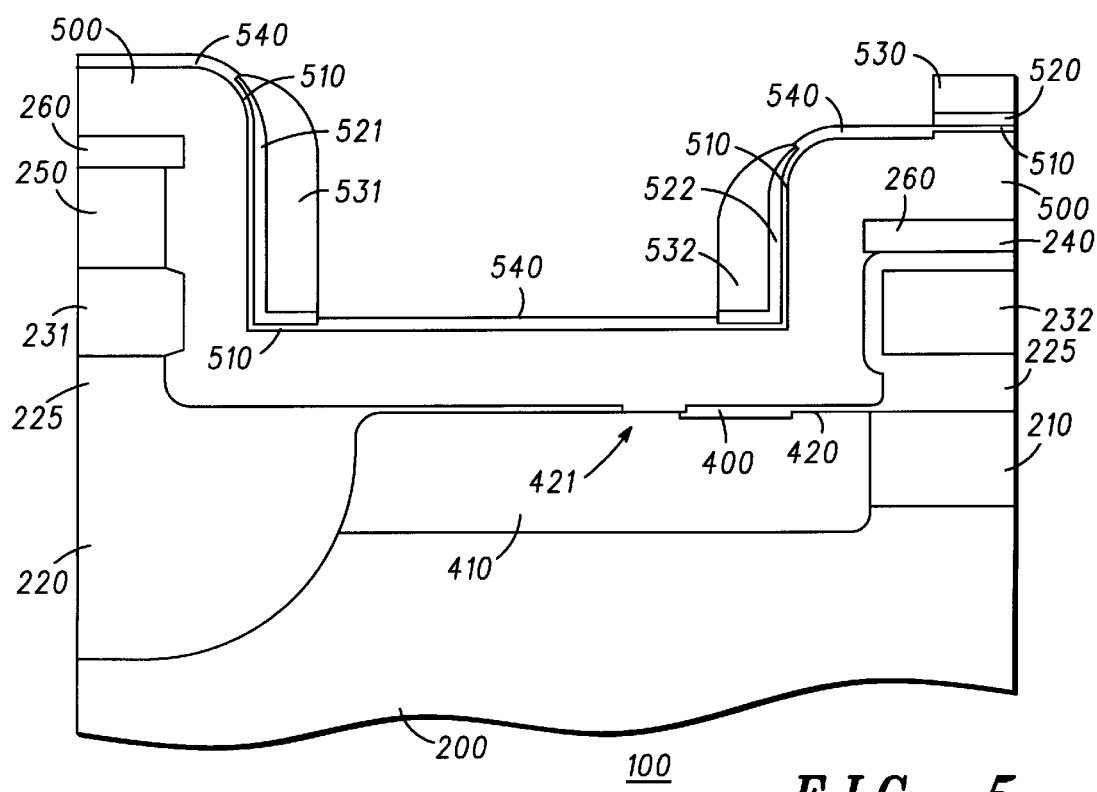

Continuing with FIG. 5, a silicon layer 500 is deposited. As an example, layer 500 can have a thickness of approximately 150–250 nanometers, is preferably comprised of amorphous silicon, and can include silicon layer 430 (FIG. 4). Silicon layer 500 is deposited over gate oxide layer 420, over lens oxide layer 400, and into hole 421 to contact substrate 200.

Then, the entire top surface of silicon layer 500 is thermally oxidized to form an oxide layer 510. As an example, oxide layer 510 can be approximately 10–20 nanometers thick. Next, a nitride layer 520 is deposited over oxide layer 510 to a thickness of approximately 50–100 nanometers. Subsequently, an oxide layer 530 is deposited over nitride layer 520. Layer 530 is preferably comprised of TEOS and has a thickness of approximately 200–400 nanometers.

Layers 530 and 520 are sequentially etched to expose portions of oxide layer 510. This etching process forms an oxidation etch mask for silicon layer 500. This etching process forms spacers 531 and 532 out of oxide layer 530. Spacer 531 is located adjacent to dielectric structure 250, and spacer 532 is located adjacent to dielectric structure 240 and overlies oxide layer 400. During the etching of oxide layer 530, an etch mask is formed over a portion of dielectric structure 240, an etch mask is not used over spacers 531 and 532. An anisotropic etching process and the topology underneath layer 530 inherently produce spacers 531 and 532. Spacers 531 and 532 serve as an etch mask during the etching of nitride layer 520. Therefore, the portions of layer 520 that are covered or protected by spacers 531 and 532 are not removed. These remaining portions of layer 520 form spacers 521 and 522. Then, the remaining portions of layer 530, including spacers 531 and 532, are removed while leaving spacers 521 and 522. It is noted that this removal of layer 530, including spacers 531 and 532, is not depicted in FIG. 5 to facilitate the explanation of the manufacturing process for component 100.

Next, in FIG. 5, the portions of silicon layer 500 located underneath the exposed portions of oxide layer 510 are thermally oxidized to form a lens oxide layer 540. As an example, oxide layer 540 can have a thickness of approximately 20–40 nanometers thick and can include oxide layer 510. After this oxidation process, nitride layer 520, including spacers 521 and 522, are removed. Next, the portions of oxide layer 510 that cover the horizontal surfaces of silicon layer 500 are removed using an isotropic etching process. This anisotropic etching process thins lens oxide layer 540, but does not remove layer 540.

Then, the portions of silicon layer 500 that are not covered by lens oxide layer 540 are etched away to form holes in silicon layer 500 that expose portions of field oxide region 220 and lens oxide layer 400. This etching process simultaneously forms or defines the gate and source electrodes for the MOSFET, and at least one of the etched holes in silicon layer 500 separate the gate and source electrodes from each other. In the preferred embodiment, each of silicon layers 500 (FIG. 5) and 430 (FIG. 4) form a portion of each of the gate and source electrodes.

Figure 6:
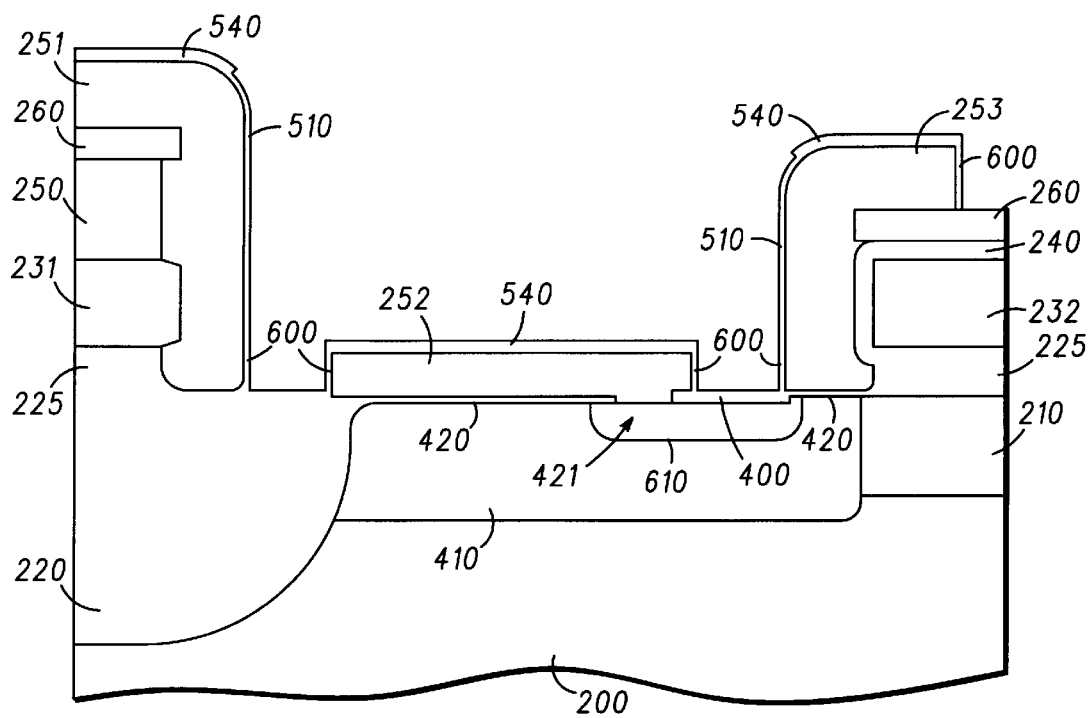

FIG. 6 illustrates silicon layer 500 after the etching process. Silicon layer 500 is separated into three distinct and non-contiguous portions. Portions 251 and 252 are subsequently used as the source electrode, and the third portion forms a gate electrode 253. Source electrode portion 251 overlies portion 231 of the field plate and dielectric structure 250, but is absent over portion 232 of the field plate. The configuration of source electrode portion 251 electrically shorts the source electrode to portion 231 of the field plate. Gate electrode 253 overlies channel region 410 and also overlies a portion of portion 232 of the field plate and dielectric structure 240, but is absent over portion 231 of the field plate. Gate electrode 253 is not electrically shorted to and is preferably completely electrically isolated from portion 232 of the field plate.

Next, the sidewalls of silicon layer 500 that were formed by the previous etching process are thermally oxidized to form an oxide layer 600. As an example, oxide layer 600 can have a thickness of approximately 10–20 nanometers. Then, a source region 610 is formed in substrate 200. As an example, arsenic or phosphorous ions can be implanted through the hole in silicon layer 500 between source electrode portion 252 and gate electrode 253, through oxide layer 400, and into the top surface of substrate 200 to form source region 610 in a portion of channel region 410. Source region 610 has a higher doping concentration or level than either of channel region 410 or drain region 210. Source electrode portion 252 and gate electrode 253 serve as a self-aligned implant mask for the formation of source region 610. The formation of source region 610 also simultaneously dopes source electrode portions 251 and 252 and gate electrode 253. A portion of source region 610 is also formed by dopant diffusion from source electrode portion 255 through opening 421 in gate oxide layer 420 and into substrate 200.

The distance between an edge of source region 610 and drain region 210 defines the gate length for the MOSFET. The manufacturing process described herein provides improved gate length control because of two factors: the deposition thickness of silicon layer 500 and the sequence of forming source region 610. The thickness of silicon layer 500 controls the gate length because of the spacer configuration of gate electrodes 253. Source region 610 is formed towards the end of the process after, for example, the high temperature thermal oxidation used to form gate oxide 420 so as to minimized the amount of lateral diffusion of region 610.

Then, as illustrated in FIG. 1, a nitride layer 120 is deposited and anisotropically etched without an etch mask to leave spacer portions adjacent to the source and gate electrodes. As an example, nitride layer 120 can have a thickness of approximately 20–40 nanometers. Then, an oxide layer 130 is deposited and anisotropically etched without an etch mask to leave spacer portions, as illustrated in FIG. 1. As an example, layer 130 can be comprised of TEOS and can have a thickness of approximately 500–1000 nanometers.

Next, an etch mask is formed over only a portion of source electrode portion 252 (FIG. 6) that is closer to source region 610 and dielectric structure 240, and a hole is etched into portion 252 to separate portion 252 into adjacent source electrode portions 254 and 255, as illustrated in FIG. 1. A right hand portion of the hole is defined by the etch mask, and a left hand portion of the hole is defined by the spacer portion of oxide layer 130 that is adjacent to dielectric structure 250 and portion 231 of the field plate. The hole overlies a portion of channel region 410 and exposes a portion of gate oxide layer 420.

Then, a channel contact region 110 is formed in substrate 200. As an example, boron ions can be implanted through the hole between source electrode portions 254 and 255, through gate oxide layer 420, and into the top surface of substrate 200 to form channel contact region 110 in a portion of channel region 410. Source electrode portion 255 and the spacer portions of oxide layer 130 serve as a self-aligned implant mask. Channel contact region 110 has a higher doping concentration or level than either of channel region 410, but is not as heavily doped as source region 610.

After forming region 110, the dopant in regions 110, 410, and 610 within substrate 200 are activated by preferably using a rapid thermal annealing process to reduce the amount of dopant diffusion. As an example, the anneal may last approximately 10–60 seconds at temperatures of approximately 900–1100 degrees Celsius . Preferably, the doped regions are annealed for approximately 40 seconds at about 1050 degrees Celsius.

Next, the exposed portion of gate oxide layer 420 is subsequently removed, preferably by a wet etchant, to reveal an underlying portion of the top surface of substrate 200. Then, source electrode portions 251, 254, and 255 and channel contact region 110 are electrically shorted together. As an example, a silicide process can be used to electrically couple together channel contact region 110 and adjacent source electrode portions 254 and 255. The nitride spacer portions of layer 120 and the oxide spacer portions of layer 130 prevent the silicide process from shorting together gate electrode 253 and source electrode portion 255. Next, an interconnect layer is deposited and etched to form portions 141 and 142. As an example, the interconnect layer can be comprised of a metal such as aluminum and can have a thickness of approximately 0.8–1.5 micrometers. Portion 141 electrically shorts together source electrode portions 251, 254, and 255 and channel contact region 110.

Also illustrated in FIG. 1 is a drain electrode 160, which can be formed using conventional processes known in the art. The bottom portion of substrate 200 that is adjacent to drain electrode 160 can also have doped regions, as known in the art.

Therefore, an improved semiconductor component and method of manufacture is provided to overcome the disadvantages of the prior art. The MOSFET of the semiconductor component is a tetrode device having a gate electrode, a drain electrode, a source electrode, and a field plate or shield electrode that is electrically shorted to the source electrode. The field plate blocks or shields the drain region of the MOSFET from the electrical field of gate electrode. This shielding lowers the gate-to-drain capacitance, which increases the frequency response of the MOSFET. Compared to the prior art, the MOSFET also has lower gate resistance that is provided by, for example, portion 142 of the interconnect layer. This lower gate resistance also increases the frequency response of the MOSFET. The higher frequency response of the MOSFET increases the number of suitable applications While the invention has been particularly shown and described mainly with reference to preferred embodiments, it will be understood by those skilled in the art that changes in form and detail may be made without departing from the spirit and scope of the invention. For instance, the numerous details set forth herein such as, for example, material compositions and layer thicknesses are provided to facilitate the understanding of the present invention and are not provided to limit the scope of the invention. Accordingly, the disclosure of the present invention is not intended to be limiting. Instead, the disclosure of the present invention is intended to be illustrative of the scope of the invention, which is set forth in the following claims.

What is claimed is:

1. A method of manufacturing a semiconductor component comprising:

providing a semiconductor substrate having a first surface and a second surface opposite the first surface;

forming a drain electrode of a transistor at the second surface;

simultaneously forming a silicon gate electrode and silicon source electrodes at the first surface of the transistor; and simultaneously forming a source region while doping the silicon gate electrode and silicon source electrodes.

2. The method of claim 1 wherein simultaneously forming the silicon source electrodes and the silicon gate electrode further comprises:

depositing a silicon layer over the first surface of the semiconductor substrate; and etching the silicon layer to form portions of the source electrodes and the gate electrode.

3. The method of claim 2 wherein etching the silicon layer to form portions of the source electrodes and the gate electrode includes separating the source electrode into two separate source electrode portions.

4. The method of claim 1 wherein the method of simultaneously forming the source region while doping the source and gate electrodes includes controlling the distance between the source region and a drain region.

5. The method of claim 4 wherein controlling the distance between the source region and the drain region includes:

controlling the deposition thickness of the silicon layer to create a spacer configuration for the gate electrode; and forming the source region after high temperature oxidation processes have been performed in order to control lateral diffusion.

6. A method of manufacturing a semiconductor component exhibiting a higher frequency response comprising:

providing a semiconductor substrate having a first surface and a second surface opposite the first surface;

forming a shield electrode to block a drain region from an electric field of a silicon gate electrode;

forming an enhanced drain region on the first surface; and forming the silicon gate electrode above the enhanced drain region such that the shield electrode separates a portion of the gate electrode from the drain region.

7. The method of claim 6 wherein forming the shield electrode comprises:

forming an oxide layer over the semiconductor substrate; and forming a conductive layer over the oxide layer.

8. The method of claim 6 wherein forming the enhanced drain region comprises implanting ions into an epitaxial layer of the semiconductor substrate before forming the shield electrode.

9. The method of claim 6 wherein forming the silicon gate electrode comprises:

depositing a silicon layer over the first surface of the semiconductor substrate; and etching the silicon layer to form the gate electrode.

10. A method of manufacturing a semiconductor component utilizing silicon electrodes comprising:

providing a semiconductor substrate having a first surface and a second surface opposite the first surface;

forming an active region of a first conductivity type on the first surface;

forming a silicon electrode in contact with the active region at a contact point;

diffusing a source area in the active region of a second conductivity type such that the source area below the contact point of the silicon electrode is of the second conductivity type; and forming a metallic electrode in contact with the silicon electrode.

11. The method of claim 10 wherein forming the active region comprises implanting ions of the first conductivity type into the top surface of the semiconductor substrate through a first oxide layer and a second oxide layer.

12. The method of claim 10 wherein forming the silicon electrode comprises:

depositing a silicon layer over the first surface of the semiconductor substrate; and etching the silicon layer to form a portion of the silicon electrode.

13. The method of claim 10 wherein diffusing the source area in the active region of a second conductivity type comprises:

implanting ions into the active region through an oxide layer; and using the silicon electrode and a gate electrode as a self-aligned implant mask for the formation of the source region.

14. The method of claim 10 wherein forming a metallic electrode in contact with the silicon electrode comprises depositing a conductive interconnect layer to make contact with the silicon electrode.

* * * * *